(12) United States Patent
Karlsen et al.

(10) Patent No.: US 11,256,076 B2
(45) Date of Patent: Feb. 22, 2022

(54) HIGH POWER LASER SYSTEM

(71) Applicant: nLIGHT, Inc., Vancouver, WA (US)

(72) Inventors: Scott R. Karlsen, Battle Ground, WA (US); Robert J. Martinsen, West Linn, OR (US); Keith W. Kennedy, Vancouver, WA (US)

(73) Assignee: nLIGHT, Inc., Camas, WA (US)

( * ) Notice: Subject to any disclaimer, the term of this patent is extended or adjusted under 35 U.S.C. 154(b) by 798 days.

(21) Appl. No.: 16/149,712

(22) Filed: Oct. 2, 2018

(65) Prior Publication Data

US 2019/0146200 A1   May 16, 2019

Related U.S. Application Data

(63) Continuation of application No. 13/431,857, filed on Mar. 27, 2012, now Pat. No. 10,095,016, which is a continuation-in-part of application No. 12/984,085, filed on Jan. 4, 2011, now Pat. No. 8,835,804.

(51) Int. Cl.
*G02B 19/00* (2006.01)
*H01S 5/00* (2006.01)
*H01S 5/40* (2006.01)

(52) U.S. Cl.
CPC ..... *G02B 19/0052* (2013.01); *G02B 19/0028* (2013.01); *H01S 5/005* (2013.01); *H01S 5/4012* (2013.01)

(58) Field of Classification Search
CPC ............. G02B 19/0028; G02B 19/0052; G02B 13/02; G02B 13/04; G02B 13/22; H01S 5/4012; H01S 5/005; C03C 3/06
USPC ............ 219/121.67, 121.73, 121.74, 121.75, 219/121.76, 121.77; 372/6
See application file for complete search history.

(56) References Cited

U.S. PATENT DOCUMENTS

| | | |
|---|---|---|
| 3,748,015 A | 7/1973 | Offner |
| 3,773,404 A | 11/1973 | Moore |
| 4,293,186 A | 10/1981 | Offner |
| 4,377,339 A | 3/1983 | Coppock |
| 4,492,427 A | 1/1985 | Lewis et al. |
| 4,536,639 A | 8/1985 | Crahay |
| 4,688,904 A | 8/1987 | Hirose et al. |
| 4,711,535 A | 12/1987 | Shafer |
| 4,932,747 A | 6/1990 | Russell et al. |
| 5,153,773 A | 10/1992 | Muraki et al. |

(Continued)

FOREIGN PATENT DOCUMENTS

| | | |
|---|---|---|
| CN | 1782781 | 6/2006 |
| CN | 101529288 | 9/2009 |

(Continued)

OTHER PUBLICATIONS

Erdmann, et al., "Coherence management for microlens laser beam homogenizers," Proceedings of SPIE, Vo. 4775, pp. 145-154 (Aug. 2002).

(Continued)

*Primary Examiner* — Dana Ross
*Assistant Examiner* — James F Sims, III
(74) *Attorney, Agent, or Firm* — Klarquist Sparkman, LLP

(57) ABSTRACT

A laser system capable of producing a stable and accurate high-power output beam from one or more input beams of corresponding laser sources comprises one or more optical elements configured to receive the input beams wherein at least one of said one or more optical elements is made of high purity fused silica.

20 Claims, 7 Drawing Sheets

(56) References Cited

U.S. PATENT DOCUMENTS

| | | |
|---|---|---|
| 5,224,200 A | 6/1993 | Rasmussen et al. |
| 5,517,359 A | 5/1996 | Gelbart |
| 5,586,132 A | 12/1996 | Levy |
| 5,619,245 A | 4/1997 | Kessler et al. |
| 5,638,220 A | 6/1997 | Ohtomo et al. |
| 5,673,135 A | 9/1997 | Yoshino |
| 5,719,704 A | 2/1998 | Shiraishi et al. |
| 5,936,761 A | 8/1999 | Kubota et al. |
| 6,040,553 A | 3/2000 | Ross |
| 6,114,088 A | 9/2000 | Wolk et al. |
| 6,169,565 B1 | 1/2001 | Ramanujan et al. |
| 6,498,680 B1 | 12/2002 | Zhou |
| 6,509,547 B1 | 1/2003 | Bernstein et al. |
| 6,529,542 B1 | 3/2003 | Karlsen et al. |
| 6,531,681 B1 | 3/2003 | Markle et al. |
| 6,560,039 B1 | 5/2003 | Webb et al. |
| 6,618,174 B2 | 9/2003 | Parker et al. |
| 6,678,308 B1 | 1/2004 | Matthews |
| 6,707,532 B2 | 3/2004 | Suzuki |
| 6,873,398 B2 | 3/2005 | Sievers |
| 6,980,295 B2 | 12/2005 | Lerner |
| 6,985,226 B2 | 1/2006 | Lerner |
| 7,006,217 B2 | 2/2006 | Lerner |
| 7,158,215 B2 | 1/2007 | Harned |
| 7,167,630 B2 | 1/2007 | Eyal et al. |
| 7,253,376 B2 | 8/2007 | Zhang et al. |
| RE39,846 E | 9/2007 | Tanitsu et al. |
| 7,277,229 B2 | 10/2007 | Kato |
| 7,293,882 B2 | 11/2007 | Lerner |
| 7,317,469 B2 | 1/2008 | Kim et al. |
| 7,355,800 B2 | 4/2008 | Anikitchev |
| 7,418,172 B2 | 8/2008 | Tanaka et al. |
| 7,502,537 B2 | 3/2009 | Kurahashi |
| 7,519,493 B2 | 4/2009 | Atwell et al. |
| 7,545,403 B2 | 6/2009 | Kang et al. |
| 7,545,446 B2 | 6/2009 | Lerner et al. |
| 7,704,666 B2 | 4/2010 | Noh et al. |
| 7,745,991 B2 | 6/2010 | Yamazaki et al. |
| 7,776,493 B2 | 8/2010 | Kang et al. |
| 7,792,249 B2 | 9/2010 | Gertner et al. |
| 7,821,718 B1 | 10/2010 | Govyadinov et al. |
| 7,847,940 B2 | 12/2010 | Karasyuk et al. |
| 7,851,725 B2 | 12/2010 | Dane et al. |
| 7,885,012 B2 | 2/2011 | Reynolds |
| 7,892,382 B2 | 2/2011 | Bellmann et al. |
| 7,970,040 B1 | 6/2011 | Sprangle |
| 7,995,298 B2 | 8/2011 | Chen |
| 8,062,986 B2 | 11/2011 | Khrapko et al. |
| 8,483,533 B1 | 7/2013 | Mehl |
| 8,821,963 B2 | 9/2014 | Tanaka et al. |
| 2003/0016450 A1 | 1/2003 | Bluemel et al. |
| 2003/0128543 A1 | 7/2003 | Rekow |
| 2003/0202251 A1 | 10/2003 | Yamazaki |
| 2003/0226834 A1 | 12/2003 | Ishikawa |
| 2004/0036961 A1 | 2/2004 | McGuire |
| 2004/0065646 A1 | 4/2004 | Halpin |
| 2004/0090609 A1 | 5/2004 | Komatsuda |
| 2004/0223330 A1 | 11/2004 | Broude et al. |
| 2004/0258377 A1 | 12/2004 | Berkey et al. |
| 2005/0045604 A1 | 3/2005 | Talwar et al. |
| 2005/0098260 A1 | 5/2005 | Chen |
| 2006/0012842 A1 | 1/2006 | Abu-Ageel |
| 2006/0102605 A1 | 5/2006 | Adams et al. |
| 2006/0120075 A1 | 6/2006 | Takeda |
| 2006/0176912 A1 | 8/2006 | Anikitchev |
| 2006/0246693 A1 | 11/2006 | Tanaka et al. |
| 2007/0063226 A1 | 3/2007 | Tanaka et al. |
| 2007/0084837 A1 | 4/2007 | Kosmowski |
| 2007/0147065 A1 | 6/2007 | Nagata |
| 2007/0153847 A1 | 7/2007 | Faircloth et al. |
| 2008/0025732 A1 | 1/2008 | Hattori |
| 2008/0137042 A1 | 6/2008 | Alasaarela |
| 2008/0210671 A1 | 9/2008 | Jennings et al. |
| 2008/0268201 A1 | 10/2008 | Fiacco et al. |
| 2008/0308534 A1 | 12/2008 | Li et al. |
| 2009/0046923 A1 | 2/2009 | Chang et al. |
| 2009/0127477 A1 | 5/2009 | Tanaka |
| 2009/0168149 A1 | 7/2009 | Petersson et al. |
| 2009/0219491 A1 | 9/2009 | Williams et al. |
| 2009/0236495 A1 | 9/2009 | Jennings et al. |
| 2009/0296751 A1 | 12/2009 | Kewitsch et al. |
| 2010/0033508 A1 | 2/2010 | Mizushima |
| 2010/0048036 A1 | 2/2010 | Tanaka et al. |
| 2010/0097680 A1 | 4/2010 | Naftali et al. |
| 2010/0140478 A1 | 6/2010 | Wilson et al. |
| 2010/0171931 A1 | 7/2010 | Kessler |
| 2010/0254717 A1 | 10/2010 | Miller |
| 2011/0043900 A1 | 2/2011 | Bayramian |
| 2012/0045169 A1 | 2/2012 | Hu |
| 2012/0057345 A1 | 3/2012 | Kuchibhotla |
| 2012/0069861 A1 | 3/2012 | Neuberger |
| 2012/0248078 A1 | 10/2012 | Zediker et al. |
| 2012/0268836 A1 | 10/2012 | Mercado |
| 2012/0273269 A1 | 11/2012 | Rinzler et al. |
| 2013/0058092 A1 | 3/2013 | Anisimov |
| 2013/0070207 A1 | 3/2013 | Korenaga |
| 2013/0077147 A1 | 3/2013 | Efimov |
| 2013/0107360 A1 | 5/2013 | Kurtz et al. |

FOREIGN PATENT DOCUMENTS

| | | |
|---|---|---|
| CN | 101656394 | 2/2010 |
| CN | 102918431 | 2/2013 |
| CN | 103227417 | 7/2013 |
| DE | 102010052675 | 5/2012 |
| JP | H05218555 | 8/1993 |
| JP | 05-277776 | 10/1993 |
| JP | 2000-343257 | 12/2000 |
| JP | 3563065 | 9/2004 |
| JP | 2006-278491 | 10/2006 |
| JP | 2014013833 | 1/2014 |
| WO | WO 2011/142849 | 11/2011 |

OTHER PUBLICATIONS

First Office Action from the State Intellectual Property Office of the People's Republic of China for Chinese App. No. 201510120720.6, dated Sep. 15, 2017, 13 pages. (Copy submitted).

French et al., "Absorption Edge and Band Gap of SiO2 Fused Silica Glass," Ceramic Transactions, 28:63-80. (1992).

International Search Report and Written Opinion for International Application No. PCT/US2013/033424, 9 pages, dated Jul. 18, 2013.

Positive Light, Inc. "Relay Imaging in Rod Amplifier Systems," Technical Bulletin, 2 pages, (May 2002).

Second Office Action from the State Intellectual Property Office of the People's Republic of China for Chinese App. No. 201510120720.6, dated Jun. 8, 2018, 8 pages. (Copy submitted).

Schmitt et al., "Illumination uniformity of laserfusion pellets using induced spatial incoherence," Journal of Applied Physics, vol. 60(1), pp. 6-13 (Jul. 1, 1986).

Summary of First Office Action from the State Intellectual Property Office of the People's Republic of China for Chinese App. No. 201380012279.9, dated Oct. 26, 2015, 4 pages.

Third Office Action from the State Intellectual Property Office of the People's Republic of China for Chinese App. No. 201380012279.9, dated Sep. 9, 2016, 14 pages. (Copy submitted).

HIGH POWER LASER SYSTEM

CROSS REFERENCE TO RELATED APPLICATION

This application is a continuation of application Ser. No. 13/431,857, filed Mar. 27, 2012, which is a continuation-in-part of application Ser. No. 12/984,085, filed Jan. 4, 2011, both of which are incorporated herein by reference in their entirety.

BACKGROUND

1. Field of the Invention

Generally, the field of the present invention is beam homogenizers. More particularly, the present invention relates to the homogenization of fiber coupled light sources.

2. Background Art

Advances in semiconductor lasers permit manufacturers to offer increasingly higher laser powers at a variety of wavelengths for a wide variety of applications. Typical applications of semiconductor lasers include materials processing (cutting and scribing materials), communications systems, medical devices, lighting, and analytical instrumentation. In many applications, to provide even higher optical powers, outputs from multiple devices are combined using combinations of lenses, mirrors, bulk beamsplitters, and fused fiber couplers. In many cases, laser beams produced by semiconductor lasers are not circular but elliptical, and typically have differing beam waists based on the elongated shape of the laser emission area.

Some applications impose difficult requirements on beam uniformity. While considerable effort has been directed to combining laser outputs to produce uniform beams, the available systems nevertheless continue to exhibit some significant limitations. Complex, expensive arrangements of numerous optical elements can be needed, and such elements can require precise, stable alignment to produce an acceptable combined beam.

Thus, despite the considerable efforts that have been exerted for many years, there remains a long felt need for laser beam combining systems that provide highly uniform combined optical beams.

SUMMARY

Irradiation systems include a plurality of fiber coupled light sources, each source configured to produce corresponding beams propagating along respective propagation axes that are situated in a common direction such as a common plane and in relation to an optical axis. The radiation beams are displaced with respect to each other and are incident to a converging optical element situated along the optical axis that directs the beams toward the optical axis. The converging optical element can be a refractive, reflective, or other optical element having a positive optical power. In some examples, the converging element is a cylindrical mirror or lens. The irradiation systems also include a lens situated to receive the radiation beams from the converging optical element and form corresponding beam foci that are displaced with respect to each other in a direction perpendicular to the optical axis and in the common plane. A light pipe is situated to receive the focused beams and multiply reflect the focused beams to a light pipe output so as to form an output beam. The output beam is typically a homogenized beam having an intensity uniformity of better than at least 10% along at least one axis.

In some examples, each of the fiber coupled light sources includes at least two laser diodes coupled to a multimode optical fiber. In other examples, the converging optical element is a cylindrically converging optical element and the beam foci are line foci extending perpendicularly to the common plane. In further examples, the light pipe includes a solid transparent substrate that defines a propagation volume having a rectangular cross section of width W and height H. In other examples, the light pipe includes a frontal surface of height H configured to receive the focused beams, and at least two exterior surfaces configured to direct the multiply reflected input beams from an input portion of the frontal surface to an output portion of the frontal surface so as to produce an output radiation flux. In additional representative embodiments, a beam processing lens is configured to produce a process beam based on the output radiation flux from the output portion of the frontal surface and direct the process beam to a work surface. In typical examples, the input portion and the output portion of the light pipe frontal surface are rectangular, and the process lens is configured to produce a rectangular illumination beam at the work surface. In some examples, the light pipe is situated so as to multiply reflect the focused beams based on focused beam numerical aperture in the common plane.

Methods of producing homogenized optical beams include receiving a plurality of optical beams propagating at different angles with respect to an axis. Each of the plurality of beams is directed towards the axis and the received beams are processed so as to increase beam numerical aperture in at least one direction. The processing beams are directed into a light pipe so as to produce an output beam. In some examples, each of the plurality of beams propagates in a common plane and is directed towards the axis in the common plane. In further representative examples, each of the plurality of beams has an initial beam numerical aperture in at least one direction and is processed so that the output numerical aperture in the at least one direction is at least 5 times the initial input beam numerical aperture. In additional representative examples, the light pipe is selected so that the processed beams are multiply reflected in the light pipe in a direction associated with the increased beam numerical aperture. In still other examples, beam numerical apertures are increased in the common plane, and the light pipe is selected to multiply reflect at surfaces perpendicular to the common plane. In other examples, the light pipe is selected so as to have surfaces parallel to the common plane and is situated so that the processed beams propagate within the light pipe without multiple reflection by these surfaces.

Apparatus for producing uniform optical beams include a converging optical element configured to receive a plurality of optical beams, each of the beams having an initial beam numerical aperture. A lens is situated to receive converging optical beams from the converging optical element, and is configured to increase the numerical aperture of each of the beams in at least one direction. A light pipe is configured to receive the increased numerical aperture beams, and multiply reflect the received beams to a light pipe output surface. In further embodiments, the lens is configured to increase the beam numerical aperture along a first beam cross-sectional axis, and the light pipe includes opposing surfaces perpendicular to the first beam cross-sectional axis so as to multiply reflect the received beam to the light pipe output surface. In other representative examples, a beam interleaver is configured to receive beams from a first plurality of beams propagating along a first axis and a second plurality of beams propagating along a second axis, and direct the beams of the first and second pluralities of beams so as to propagate along a common axis toward the converging optical element. In additional embodiments, the interleaver is configured to direct the beams so that the beams are adjacent as propagating to the converging optical element. In other examples, the beams are multiply reflected so as to irradiate a rectangular area of the output surface, and a lens is provided to direct a rectangular output beam to a work surface based on the irradiated rectangular area.

The foregoing and other objects, features, and advantages will become more apparent from the following detailed description, which proceeds with reference to the accompanying figures.

DETAILED DESCRIPTION

Figure 1A:
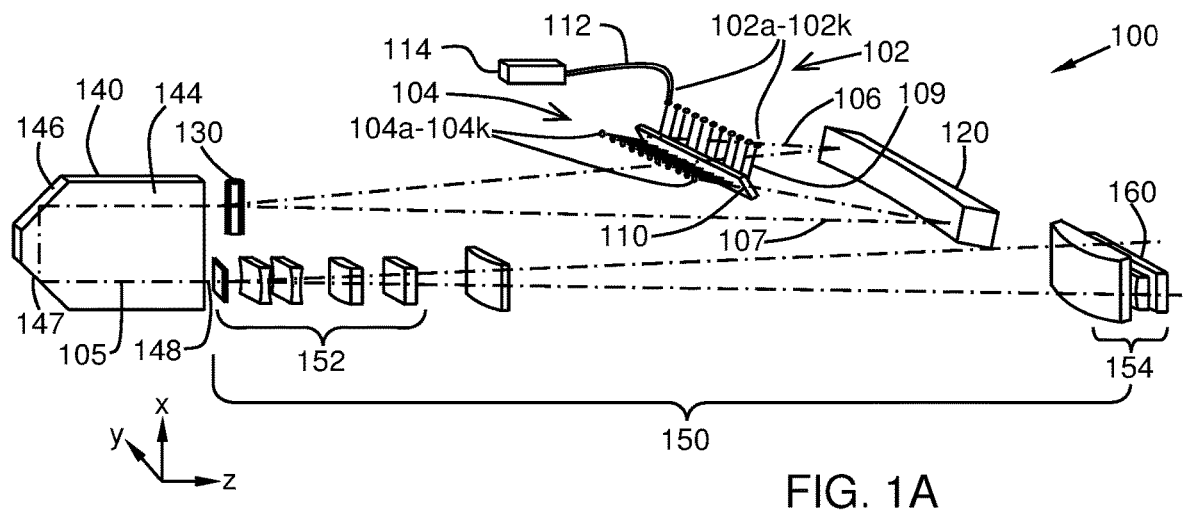
FIGS. 1A-1C respectively are perspective, plan and side illustrations of a representative illumination system in which beams from a plurality of sources are combined and homogenized in a light pipe.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

As used herein, an optical flux refers to propagating optical radiation in a wavelength range of between about 300 nm and 2000 nm, and typically between about 700 nm and 1600 nm. Typically, such optical fluxes can be propagated in solid optical waveguides such as optical fibers that are silica-based. However, in other examples, longer or shorter wavelengths can be used, and waveguides such as fibers can be made of other materials as appropriate. In addition, in convenient examples, an optical flux provided to a fiber or other waveguide can be produced by a laser or other source that can produce a spatially coherent flux, but light emitting diodes or other sources can be used, and input optical fluxes need not be spatially coherent. As used herein, devices and systems that produce radiation at wavelengths between about 300 nm and 2000 nm are referred to as illumination system or irradiation systems.

In some examples, optical beams or other optical fluxes and waveguides such as optical fibers are referred to as extending along an axis or along an optical axis or common direction or common plane. Such axes, directions, and planes are not necessarily straight, but can be bent, folded, curved, or otherwise shaped by optical elements such as mirrors, lenses, or prisms, or due to the flexibility of a waveguide such as an optical fiber. Optical beams propagating along an axis are associated with a distribution of propagation angles with respect to the axis. For convenience in the following description, an optical beam is referred to as having a beam numerical aperture that is the sine of one half of a beam divergence angle. Beam divergence can be based on angles associated with beam intensity relative to a central maximum of 95%, 75%, 50%, $1/e^2$ or other convenient relative magnitude. For asymmetric beams, two different beam numerical apertures can be used to describe beam propagation as the cross-section of such beams expands or contracts differently in different directions.

According to some examples, beam uniformity of better than 10%, 5%, 4%, 2%, or 1% is provided. As used herein, relative beam uniformity is defined as $(I_{max}-I_{min})/I_{avg}$, wherein $I_{max}$ is a beam maximum intensity, $I_{min}$ is a beam minimum intensity, and $I_{avg}$ is an average beam intensity. Typically, focused beams from laser diode bars have been used to work surfaces. However, the output from laser diode bars does not exhibit the intensity uniformity desirable for effective laser application. For example, each of the laser diodes in the bar may emit a different power distribution, and the spacing between the diodes in the bar limits the uniformity of the output beam as well. Moreover, should a particular diode fail in a laser bar the uniformity of the output beam is also adversely affected.

Figure 1B:
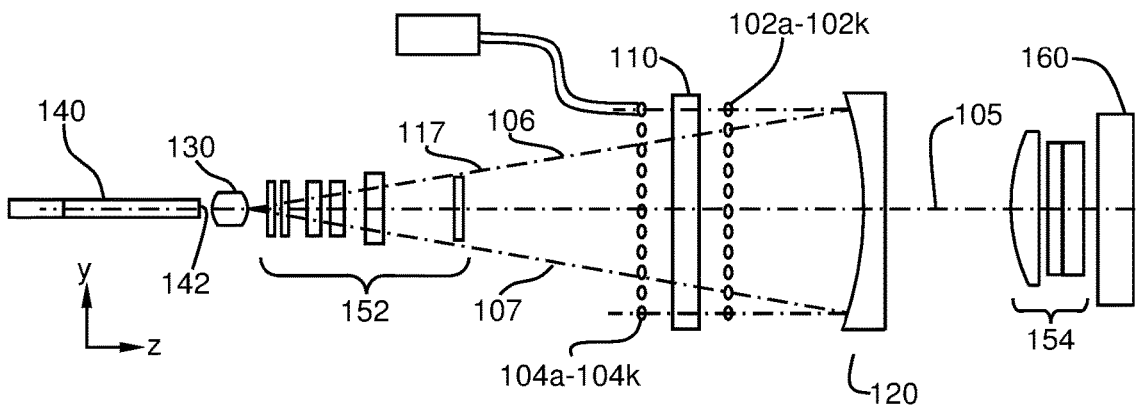
Figure 1C:
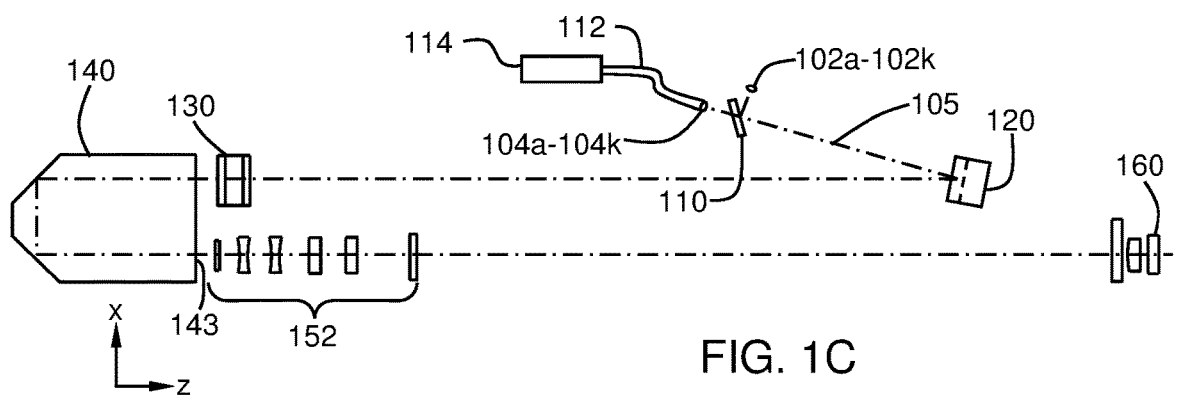

With reference to FIGS. 1A-1C, a representative illumination system 100 includes first and second linear arrays 102, 104 of fiber-coupled radiation sources 102a-102k, 104a-104k, respectively. The linear arrays 102, 104 include a plurality of fiber output ends that terminate optical fibers 112, the fibers having laser diode radiation coupled into fiber input ends thereof. Optical fibers having core diameters of about 200 µm and numerical apertures of about 0.1 are suitable. In some examples, each fiber output end is associated with radiation coupled into a corresponding input end from a single laser diode or multiple laser diodes 114. Schulte et al., U.S. Pat. No. 7,443,895 that is incorporated herein by reference describes representative laser diode arrangements that can be used to couple radiation from multiple laser diodes into a single fiber. Typically, the fiber-coupled radiation sources are nominally identical (radiation wavelength and range, power range, beam size and numerical aperture), but radiation sources can be individually selected as needed. One or more of the radiation sources can be intensity or frequency modulated as well, and a visible wavelength radiation source can be provided to aid in visual alignment.

While the linear arrays 102, 104 can be configured to provide circularly symmetric fiber output beams 109, cylindrical beams can also be produced that have different beam widths and divergence angles along different cross-sectional axes. Suitable beam forming optics coupled to the optical fiber 112 or situated between the fiber output end thereof and an interleaver 110, or elsewhere in the beam path, can include spherical and cylindrical lenses (of regular or irregular curvature), gradient index lenses, Fresnel lenses, holographic optical elements, prism-based anamorphic optical elements, and other beam forming optics as convenient. Optical fibers 112 used to deliver optical radiation to such beam forming optics can be single mode fibers or multimode fibers, and fiber core diameter and numerical aperture can be selected as convenient. In some embodiments, arrays 102, 104 have a non-linear arrangement such as a rectangular configuration, as will be discussed infra, and may include singular arrays of elements as well.

As shown in FIGS. 1A-1C, the arrays 102, 104 are arranged so that the output beams 109 have principal rays 117 emitting parallel and spaced apart from each other and in a particular associated direction for each array. Optical beams 109 from each of the fiber coupled light sources are directed to the beam interleaver 110 that is configured to reflect radiation from the fiber coupled sources 102a-102k and transmit radiation from the fiber coupled sources 104a-104k into a generally common direction or plane relative to an optical axis 105 and towards a cylindrical concave mirror 120. As shown, the principal rays 117 propagate in a generally planar direction throughout the system 100. However, in other embodiments the principal rays 117 may be arranged in another configuration, such as a rectangle, such that rays propagate throughout in a configuration other than planar. Moreover, rays 117 may be arranged so that propagation after the fiber output ends occurs along a convergent or divergent direction.

Again referring to FIGS. 1A-1C, for convenience, only propagation axes 106, 107 associated with the fiber sources 102a, 104k are shown, however an optical axis 105 is shown generally at various parts throughout the system 100. The beams can be circular, elliptical or have other cross-sectional shapes and can have different beam divergences in different directions. Typically, the beams reflected and transmitted by the interleaver 110 are approximately collimated, and beam diameters do not increase or decrease by more than a factor of about 1.5 over propagation distances of up to about 500 mm. Beams in arrays 102, 104 also may be directly coupled into the light pipe 140 without the presence of intermediate optics. In one embodiment, the fiber output ends have a wedge shape (not shown) effectively increasing the divergence angle of light emitted with respect to an axis perpendicular to the wedge and propagation direction, such as for example propagation axis 106. With the diverging beam coupled into the light pipe 130, light is multiply reflected off the interior walls thereof. The light pipe can therefore be made shorter so as to make the apparatus more compact.

As shown in FIGS. 1A-1C, the concave mirror 120 directs and converges the beams to a cylindrical lens 130 that can be implemented as a section of a glass, fused silica, a crystalline material, transmissive plastic, or other material. The cylindrical lens 130 directs the beam into a light pipe 140 at a frontal surface 142 thereof such that optical radiation from the beams is mixed and scrambled via reflection off interior walls or surfaces through a propagation region 144 therein in order to form a uniformly irradiated area 142 at an output surface 143 of the light pipe 140. Consequently, the output beam 148 of the light pipe 140 has a uniform intensity distribution across at least one axis transverse to the direction of propagation.

The light pipe 140 is conveniently formed of glass, plastic, or other material that is transmissive with respect to the optical beams. To make the optical system 100 more compact, a radiation propagation region 144 within the light pipe 140 can be folded as shown using light pipe surface 146, 147 that causes the output beam 148 to propagate in a direction opposite to that of the input beams. Additional surfaces may be added to reflect the output beam 148 into a different direction including the same or a parallel direction as the input beams. In some embodiments the propagation region 144 may also be a hollow cavity filled with air or another suitable propagation medium. In other embodiments, the light pipe 140 is formed of different materials such that the combination has a varying index of refraction within and such that light propagating through is reflected on a small scale. The small reflections further homogenize the beam 148 at the output of the light pipe 140.

A beam conditioning optical system 150 includes a first lens assembly 152 and a second lens assembly 154 that produce a processed optical beam based on radiation received from the area 142. Typically, the processed optical beam is transmitted through a protective window 160 to a work surface. The protective window 160 is generally part of a suitable housing 162, shown in FIG. 6, that contains the remainder of the optical system 100 and serves to protect optical components from damage and exposure to contamination as well as prevent unnecessary user contact that could result in misalignment or beam exposure.

Figure 2A:
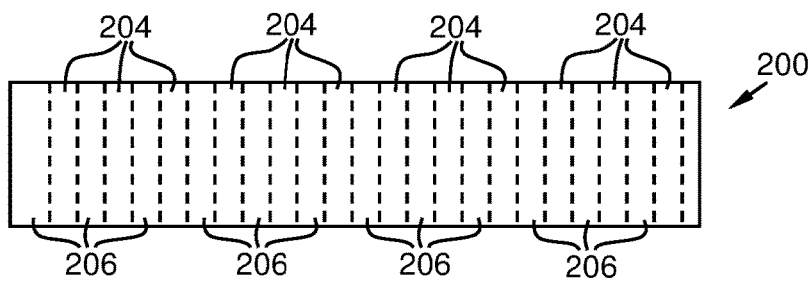
FIGS. 2A-2B respectively are plan and perspective illustrations of a beam interleaver.
Figure 2B:
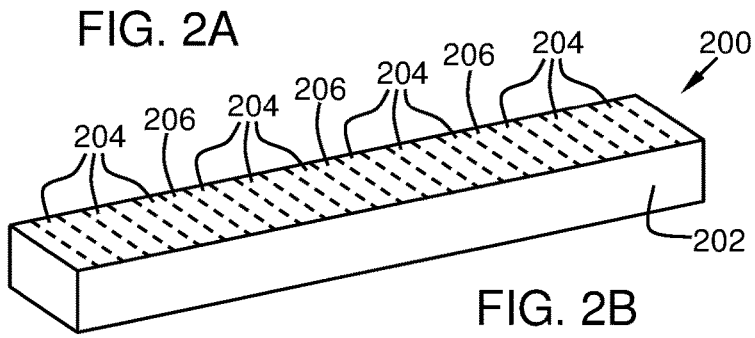

FIGS. 2A-2B illustrate a representative beam interleaver 200 that can be used in the system of FIGS. 1A-1C. The interleaver 200 comprises a transmissive substrate 202 such as quartz or glass that is provided with a plurality of reflective coated areas 204 and a plurality of transmissive areas 206. The reflective areas 204 can include a metallic reflective coating and/or a multilayer coating (such as a dielectric coating) selected to provide substantial reflectivity at one or more wavelengths at which radiation is to be received. As used herein, a substantial reflectivity refers to a reflectivity that is at least about 90%, 95%, 99%, or higher. The reflective coatings can be selected based on radiation polarization, input beam numerical aperture and cross-sectional dimensions as well. As shown in FIG. 2A, the reflective coated areas 204 are rectangular, but in other examples, these areas are circular, elliptical, oval, square, polyhedral or other shapes that permit efficient transmission and reflection of beams. Anti-reflective coatings can be applied to the transmissive area 206. Although the interleaver 200 can be situated so as to receive beams for transmission and reflection at a 45 degree angle of incidence, other angles of incidence can be used, and coatings suited to these angles used. Although in many applications, the interleaver 200 is intended for use with a plurality of sources at the same wavelength, one or more of the reflective coated areas 204 or the transmissive areas 206 can be provided with coatings suitable for different wavelengths or polarizations. While solid transmissive substrates can be used, a substrate that includes apertures situated to transmit select beams and having surface areas that are reflective can also be used. In addition, reflective or antireflective coatings can be applied on either surface of a solid substrate, and it can be advantageous to cover one surface with an anti-reflection coating while an opposing surface includes alternating anti-reflection coated and high reflectivity coated areas.

Figure 3A:
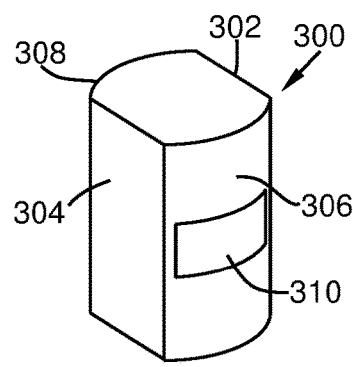
FIGS. 3A-3B respectively are perspective and plan illustrations of a rod lens such as used in the system of FIGS. 1A-1C.
Figure 3B:
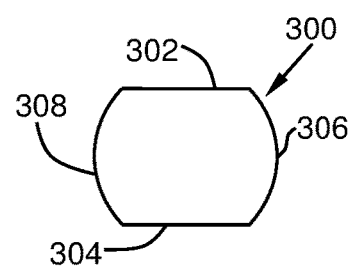

FIGS. 3A-3B illustrate a representative rod lens 300 that includes flat surfaces 302, 304 that can be used for convenient mounting, and cylindrically curved surfaces 306, 308. In use, only a portion of the rod lens 300 receives an optical flux, and a representative irradiated area 310 is illustrated. Curvatures of the surfaces 306, 308 can be substantially the same so as to form a symmetric biconvex cylindrical lens, but the curvatures of these surfaces can vary in sign and magnitude, and cylindrical or acylindrical or other curvatures or flat surfaces can be used.

Figure 4A:
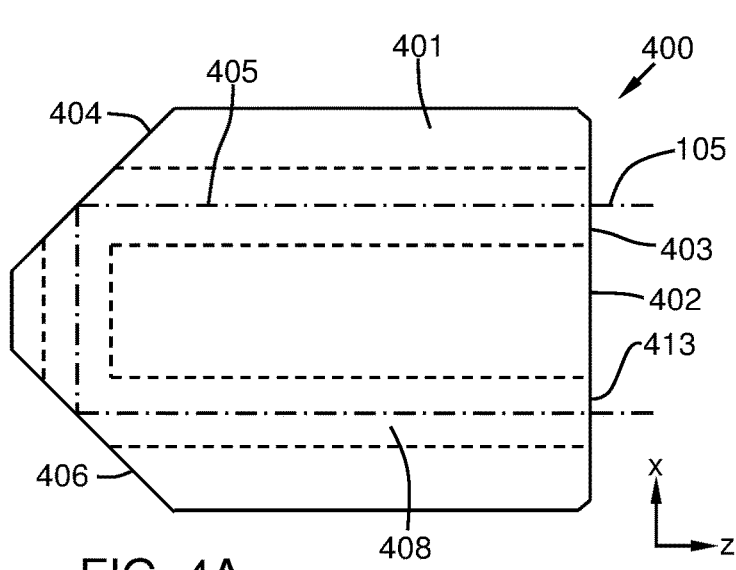
FIGS. 4A-4B respectively are plan and perspective illustrations of a folded light pipe such as used in the system of FIGS. 1A-1C.
Figure 4B:
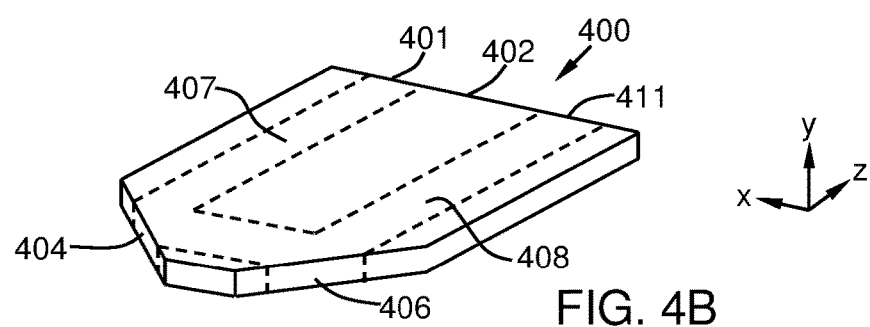

A representative folded light pipe 400 is illustrated in FIGS. 4A-4B. The light pipe 400 includes a transmissive substrate 401 having an input/output surface 402. An input portion 403 of the surface 402 configured to receive an optical flux and transmit the flux into the interior of the substrate 401. The light pipe 400 is arranged so that a flux perpendicularly incident to the surface 402 and centered in the input area 403 propagates along an axis 405 that is folded by surfaces 404, 406 and extends to a center of an output area 413 of the surface 402. With reference to orthogonal coordinate axes xyz, an input beam or beams that are substantially divergent along a y-direction experience multiple internal reflections within the light pipe 402 between opposite interior surfaces or walls 407, thereby promoting beam uniformity. If the input beam is collimated along an x-direction, the input beam propagates without substantial beam spreading. As a result, the input beam propagates through the light pipe 400 in volume 408 and becomes appreciably more uniform in intensity across the y-axis. It will be appreciated that the volume 408 and the light pipe 400 need not be folded as shown and can be arranged so that an input beam propagates along an unfolded optical axis. Alternatively, other folds, combinations of folds, or not folds can be used. Folds that provide beam reflections based on total internal reflection are generally preferred, but external reflective coatings can be used. Light pipes are conveniently formed of solid transmissive materials, but spaced apart reflective surfaces such as mirrors can be used.

Figure 5A:
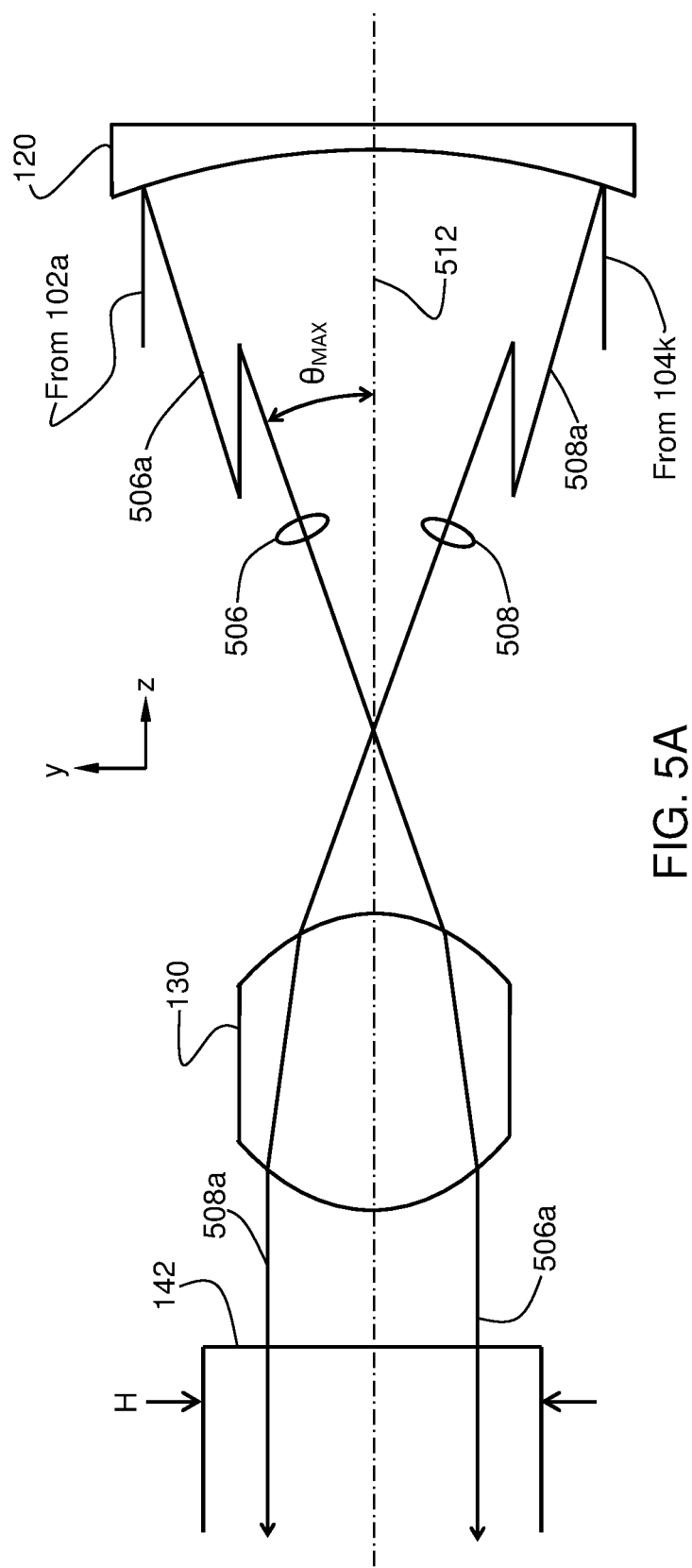
FIG. 5A schematically illustrates operation of the optical system of FIGS. 1A-1C.

The operation of the optical system of FIGS. 1A-1C is illustrated with reference to FIG. 5A. Outermost optical beams from radiation sources 102a, 104k are reflected by the concave cylindrical mirror 120 so as to propagate along axes 506a, 508a as beams 506, 508, respectively. Although the system of FIGS. 1A-1C provides 24 such beams, for clarity of illustration, other beams are omitted from FIG. 5A. The beams 506, 508 are approximately collimated and the axes 506a, 508a subtend an angle θ with respect to an optical axis 512 that is perpendicular to the frontal surface 142. The rod lens 130 receives the collimated beams 506, 508 and directs beam principal rays 506a, 508a along ray directions that are approximately parallel. Ray directions that have been omitted for clarity of illustration are also directed to become approximately parallel to each other. Additional focused lines from the other omitted beams are not shown for clarity. The separation of the beams 512a, 514k is selected based on the height H as well as the power of the incoming beams and the adjacent distance between each. Typically, the frontal surface 142 is situated so that the incoming beams are substantially captured by the light pipe.

Figure 5B:
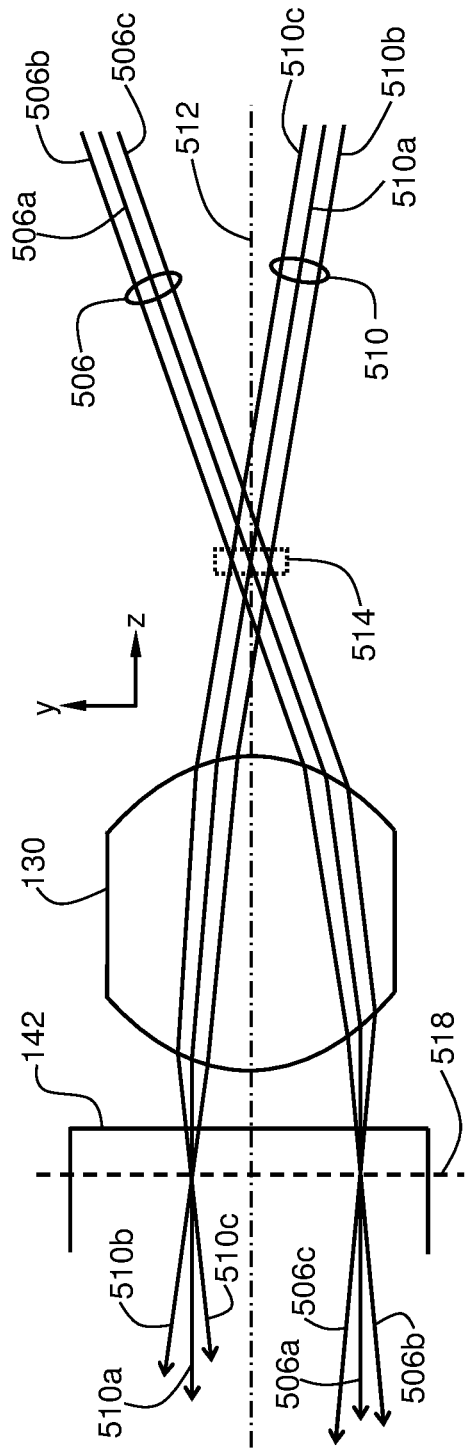
FIGS. 5B-5C schematically illustrate ray propagation of selected beams in the optical system of FIG. 5A.

FIG. 5B illustrates propagation of representative central rays (principal rays) and marginal rays from selected beams to the lens 130 and the light pipe entrance surface 142 in an exemplary embodiment. Outermost beam 506 as well as an intermediate beam 510 are illustrated. Because beam 506 is approximately collimated after reflection off the mirror 120 but before entering the rod lens 130, the associated outer marginal ray 506b and inner marginal ray 506c propagate approximately parallel to the principal ray 506a. The associated principal and marginal rays 510a-c for beam 510 propagate similarly. The representative beams 506, 510 intersect at a projection window 514, or virtual aperture, positioned before the rod lens 130. After refracting through the rod lens 130, principal rays 506a, 510a of beams 506, 510 propagate telecentrically towards and in through the surface 142 of the light pipe 140 so as to be roughly or substantially parallel to each other. Due to lens 130, the respective marginal rays, for example rays 506b, 506c, converge to a focus approximately in focal plane 518. Focal plane 518 may also be curved or have other shapes depending on the rod lens 130 and the characteristics of the beams incident therein. Due to the divergence of the beams after the focal plane 518, the beams 506, 510 multiply reflect off the interior surfaces of the light pipe 140 so as to produce a homogenized downstream intensity profile, particularly at the exit thereof such as at the output area 413 (see FIG. 4A). As shown, this multiple reflection occurs in the y-dimension, however in other embodiments the homogenization may occur in multiple dimensions.

Figure 5C:
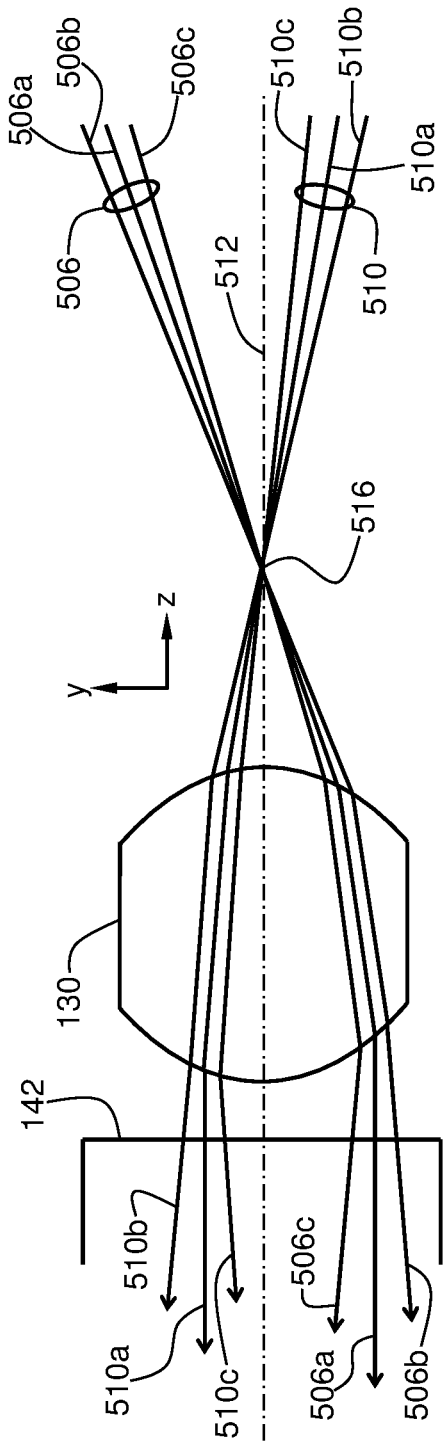

FIG. 5C illustrates ray propagation of beams 506, 510 in an alternative embodiment. Other beams are not shown for clarity. Beams 506, 510 and associated respective principal and marginal rays 506a-c, 510a-c converge to a focus 516 approximately intersecting each other along axis 512. Beams 506, 510 refract through rod lens 130 with the principal rays 506a, 510a thereof propagating roughly or substantially parallel to each other. The beams then diverge so that marginal rays multiply reflect off the interior surfaces of the light pipe 140 so as to produce a similarly homogenized downstream optical intensity profile at the output of the light pipe 140. Similar to other embodiments described herein, because the beams 506, 510 have principal rays 506a, 510a propagating approximately parallel to each other, the downstream intensity distribution becomes robust against potential failure of upstream equipment. For example, should an intermediate beam fail during use due to a faulty diode or optical fiber, the uniformity of the intensity distribution at the work surface is not significantly altered.

Figure 6:
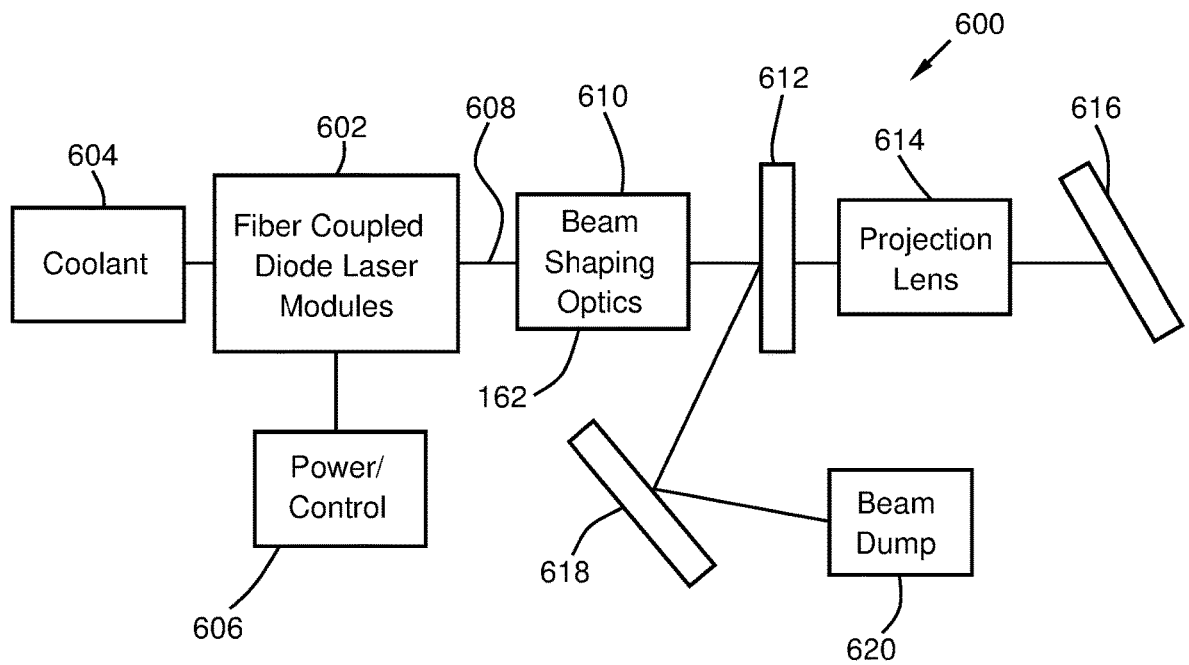
FIG. 6 is a block diagram of a system for exposing a work piece to patterns defined on a mask.

FIG. 6 illustrates a representative exposure apparatus 600. Optical power from a plurality of fiber coupled laser diode modules 602 is coupled to a beam shaping optical system 610 such as discussed above with one or more optical fibers 608. The beam shaping optical system 610 provides a uniform optical beam with a selected beam shape, and typically a rectangular beam having intensity variations of less than about 10%, 5%, 4%, or less across the beam. The laser diode modules 602 are generally coupled to a cooling system 604 and a power/control system 606. The uniform beam from the optical system 610 is directed to a mask 612, and a projection lens 614 images the mask 612 onto a work piece 616. Typically, the rectangular beam can provide optical powers of up to 2-3 kW and beam intensities of 5-10 kW/cm$^2$. In other embodiments, such as for annealing for example, beam intensities may be significantly higher, such as between 50 and 100 kW/cm$^2$. Reflected optical power from the mask 612 can be directed to a beam dump 620 with one or more optical elements 618. Typically, the beam dump 620 and the optical elements 618 are oriented so as to eliminate or reduce reflections back to the mask 612.

Figure 10:
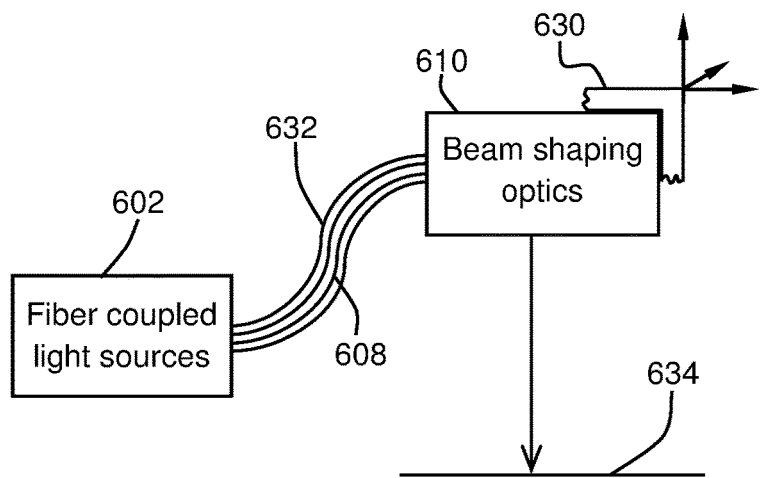
FIG. 10 is a schematic illustration of a system for mounting to a gantry.

As shown in FIG. 10, in some embodiments, the beam shaping system 610 is disposed in a housing 630 separate from the fiber coupled laser modules 602 and a harness 632 securing bendable optical fibers 608 flexibly connects the modules 602 and system 610. In this way, the system 610 is free to translate with respect to modules 602 for effective surface working, such as, for example, controlled annealing, cutting, scribing, or marking of a substrate. For example, the system 610 may be mounted to a gantry (not shown) that can move or track in order to bring the system 610 to a different position so that a separate portion of a target work surface 634 may be irradiated.

Figure 7:
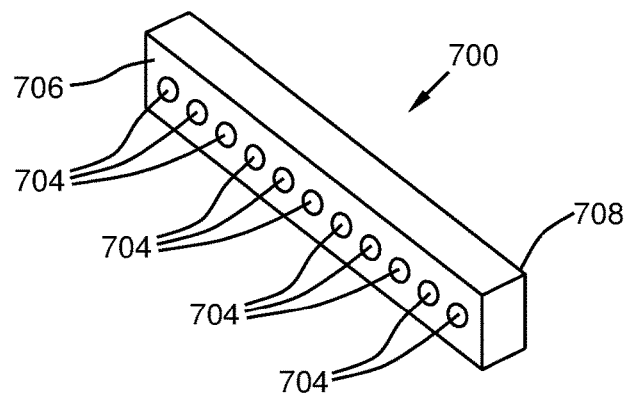
FIG. 7 is a perspective illustration of a beam interleaver.

While a beam interleaver having rectangular segments is convenient, other configuration are possible. With reference to FIG. 7, a beam interleaver 700 includes a plurality of circular (or oval) reflective regions 704 on a surface 706 of a transmissive substrate 708. The surface 706 of the transmissive substrate 708 can be provided with anti-reflections coatings outside of the regions 704 so as to enhance beam transmittance. An anti-reflection coating can also be provided on a surface opposite the surface 706. Alternatively, the regions 704 can be configured as transmissive regions with anti-reflection coatings, and the remainder of the surface 706 can be provided with a reflective coating.

Figure 8:
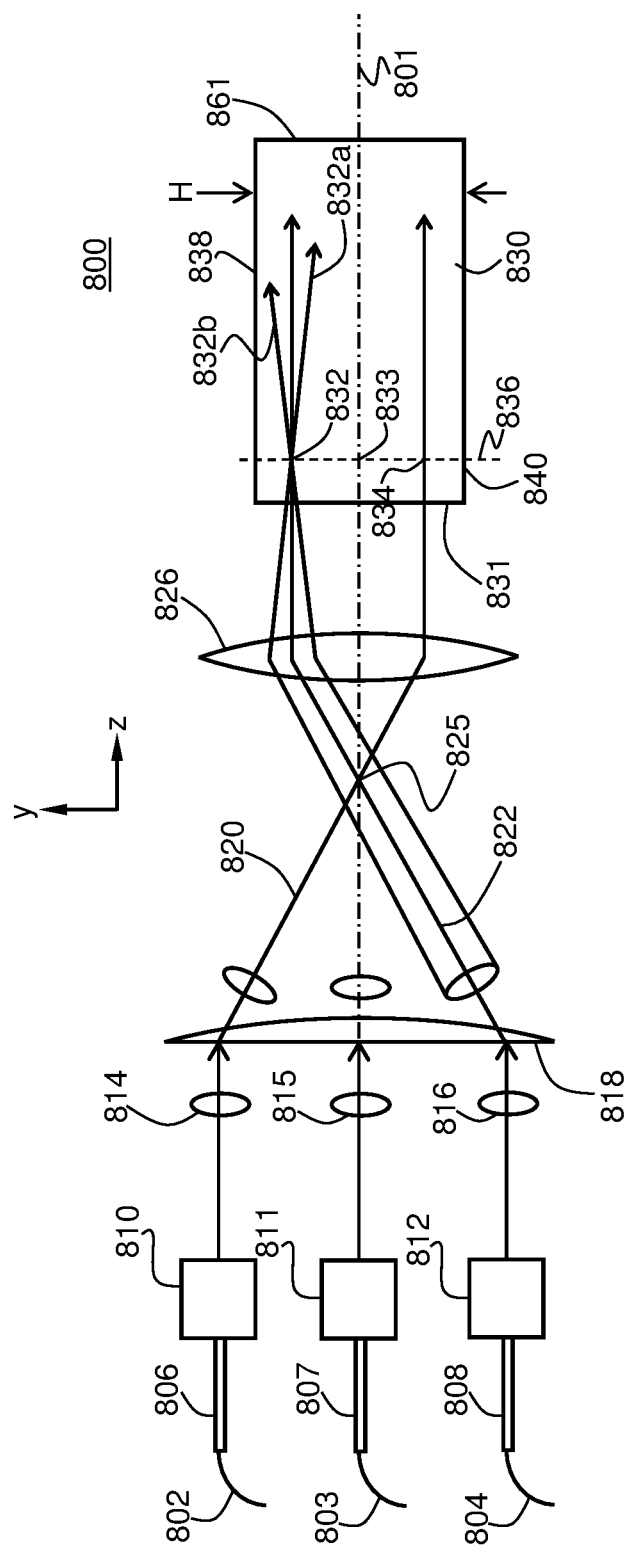
FIG. 8 is a schematic illustration of another illumination system alternative to that of FIGS. 1A-1C.

While a folded, reflective optical system can be used, optical systems using refractive optical elements can be used as well. With reference to FIG. 8, an illumination optical system 800 includes optical fiber inputs 802, 803, 804 which secured in respective ferrules 806, 807, 808. Optical radiation from the fiber inputs 802, 803, 804 is directed to beam forming optics 810, 811, 812 to produce beams 814, 815, 816, respectively that propagate along an optical axis 801. A first lens 818 is situated on the axis 801 and directs the beams 814, 815, 816 to a second lens 826 along axes 820, 801, 822, respectively. Upon exiting the first lens 818, the beams 814, 815, 816 are converging towards the second lens 826 which then directs the beam into a light pipe 830. As shown in FIG. 8, the second lens 826 receives the converging beam 816 and focuses the beam at a beam focus 832. The beam focus 832 can correspond to a minimum beam size along both the x-direction and the y-direction, but in some examples the beam focus 832 is a line focus corresponding to a beam that is focused in one direction but not in an orthogonal direction. For purposes of illustration, perimeter rays 832a, 832b are shown as intersecting on the axis 822. Similar focused beams 833, 834 corresponding to the input beams 814, 815, respectively, are also formed. The focused beams 832, 833, 834 are situated on a focal line or focal plane 836 that can be within or exterior to the light pipe 830. The focal plane 836 can also have a non-planar shape depending on the optical elements selected for use. For convenience, refraction at a frontal surface 831 of the light pipe 830 is not shown.

The focused beams 832, 834 generally propagate in the light pipe 830 within a common range of propagation angles after reflection by light pipe sidewalls 838, 840. Additional input beams can be provided so that input beams can overlap or be situated close to each other with gaps of 0.1, 0.2, 0.5, 1.0, 2.0 or more times a beam radius. A beam interleaver can be provided for this purpose. In FIG. 8, the input beams are situated in a linear array, and focusing only in a single plane is shown. The first lens 818 and the second lens 826 can be cylindrical lenses having spheric or aspheric curvatures along one axis and lacking curvature along an orthogonal axis. In other examples, two dimensional beam arrays can be used, and the first lens 818 and the second lens 826 are not cylindrical lenses. In other examples, these lenses can have differing spheric or aspheric curvatures along orthogonal directions.

Also seen in FIG. 8, before entering second lens 826, representative beams 814, 815, 816 converge on a focus 825. The second lens 826 may then be a telecentric lens such that the principal rays of beams 820, 801, 822 propagate past the second lens 826 approximately parallel to each other, and also past the second lens 826 the beams 820, 801, 822 converge on a respective beam focus 832, 833, 834 in focal plane 836. Focal plane 836 can also have curvature as well, however as shown in FIG. 8 the focus 836 is planar. Second lens 826 may also be a fourier transform lens resulting in the telecentric imaging of the representative beams 820, 801, 822 into the light pipe 830. The focal length of the fourier transform lens 826 determines the size of the image and divergence of light form each point on the image. Since the principal rays of the beams 820, 801, 822 are parallel, downstream optics, such as for example projection lens 614, operate independently of which fiber coupled light source contains power. Thus, should particular fiber coupled light sources lose power, the intensity distribution exiting the light pipe 830 remains uniform and insensitive to the power loss due to the telecentric imaging of the input beams 820, 801, 822.

The first lens 818 and the second lens 826 are shown as single element, refractive lenses. Compound or multi-element lenses can be used, and holographic, Fresnel, or other optical elements can be used. For example, the first lens 818 can be segmented to provide suitable refraction of the input beam to the second lens 826, without converging the input beams. Such refraction is provided so that the second lens 826 receives substantially all (greater than at least 80%) of the optical power in the input beams.

The frontal surface 831 of the light pipe can have a square, rectangular, or other shape. A two dimensional square array of input beams can be selected for use with a square light pipe frontal surface, and a linear or rectangular array used with a rectangular frontal surface. The light pipe 830 can be tapered in one or more directions to provide an output surface that has a larger or smaller area than the frontal surface 831, or to have a different shape or aspect ratio than the frontal surface 831. As shown in FIG. 8, the light pipe 830 has a height H in the y-direction so that focused input beams from the second lens 826 are captured in the light pipe 830.

Figure 9:
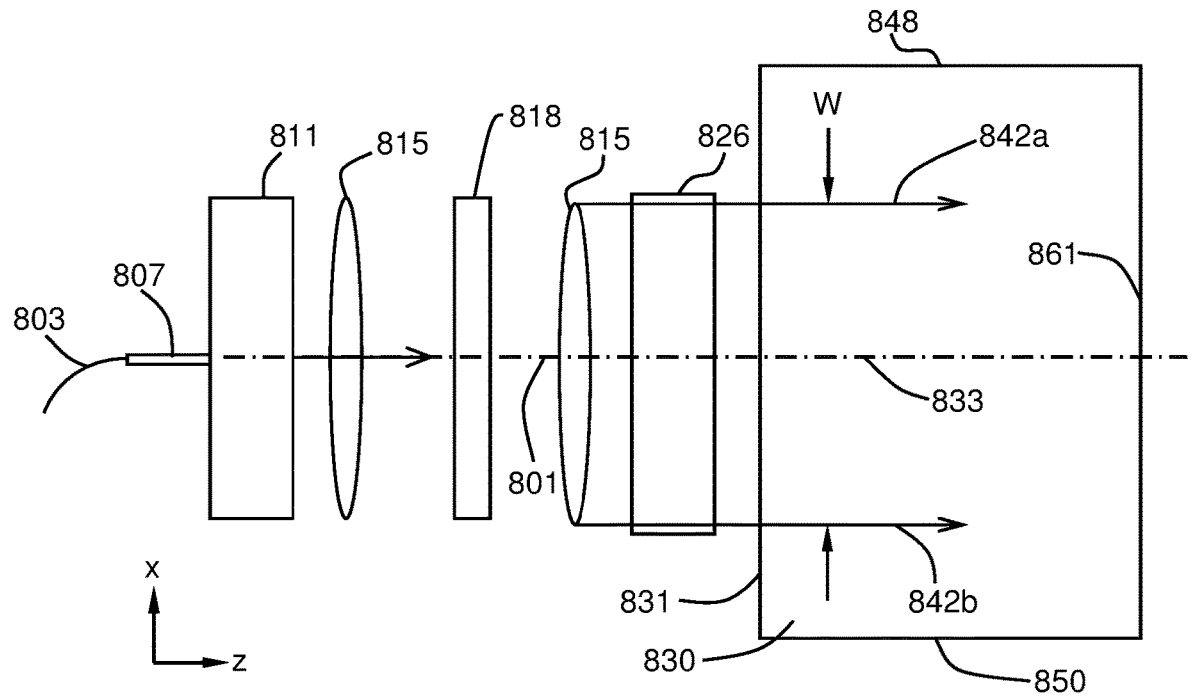
FIG. 9 is an alternative view of the illumination system of FIG. 8.

FIG. 9 is a view of the optical system of FIG. 8 in an xz-plane and containing the axis 801. The beam 815 propagates along the axis 801 through the first lens 818 and the second lens 826 without appreciable divergence in the xz-plane. The beam forming optics 811 is configured to produce a suitable beam width W that irradiates a selected portion of the light pipe frontal surface 831. As shown in FIG. 9, the beam divergence is selected so that the beam propagates within the light pipe 830 without substantial interaction with or reflection from the light pipe side walls 848, 850. It will be apparent light pipe x-axis width can be selected to provide such reflections. Beam width in the x-direction at an output surface 861 is substantially the same as at the frontal surface 831. The beam 815 is illustrated as substantially collimated in FIG. 9 and having a substantially constant beam width W. Typically, beam divergence in the x-direction can be selected so that in the x-direction the beam width does not change substantially as the beam propagates in the light pipe 830. In the view of FIG. 9, the beams 814, 816 of FIG. 9 are not shown, but are similar to the beam 815. As noted above, in other examples, beam propagation and shaping in the xz-plane and the yz-plane are substantially the same.

Typically in systems such as described above, some radiation is reflected from work surfaces or other surfaces, such as a mask, and as a result is not used in process. Such radiation can be captured with one or more beam dump that can be integrated to collect waste radiation. The beam dump generally includes an absorbent material, generally a metal, that is situated so as to receive and absorb waste radiation. The beam dump conducts the heat generated in response to waste radiation absorption away from the irradiation system. The heat can be dispersed with air-cooling or water-cooling. Optics can be placed before the beam dump to collect the reflected radiation and direct it toward the beam dump, allowing flexibility in beam dump placement and size.

Beam Homogenizer Systems Utilizing High Purity Fused Silica

While the various optical components described herein may be made from glass, fused silica, a crystalline material, transmissive plastic, or other material (as discussed hereinbefore), it has been discovered that the incorporation of high purity fused silica in one or more components is particularly useful in making systems capable of handling very high peak intensities and powers. By making the various optical components, or portions thereof, from high purity fused silica, temperature-related reliability issues, such as thermal shock, that are typical for laser systems with very high powers or intensities, can be minimized. Furthermore, thermal lensing effects are enhanced under high power operation where, in the bulk material of the optical elements, absorption, temperature-dependent refractive index, and low thermal conductivity can contribute to variability in operation of the laser system. Such variability is unsuitable for applications such as materials processing, and by making optical elements with high purity fused silica the variability and thermal lensing can be minimized as well. Moreover, by using high purity fused silica in select optical elements, allowable peak intensities are driven higher so that systems may be capable of stable operation at greater than 500 W of average power and in some instances higher than 2-3 kW of average power or even higher than 5 kW, 10 kW, or 20 kW of average power. Typical allowable peak intensities based on systems herein include intensities around 1 kW/cm$^2$ or greater.

High purity fused silica is used conventionally for applications where low absorption at UV or IR wavelengths is desired. UV absorption tends to be caused by metallic impurities while IR absorption, particularly around 943, 1246, 1383, and 1894 nm, tends to be caused by OH$^-$ impurities. As mentioned earlier, for systems disclosed herein, suitable wavelengths of operation vary for the particular application, and are typically in a range of between 300 and 2000 nm with a preferred wavelength range of between about 700 to 1300 nm. For systems using wavelengths in the wavelength range high purity fused silica can be particularly relevant as both UV and IR absorption can be reduced.

Optical elements described herein that are suitable for the implementation of high purity fused silica material include interleaver 110, cylindrical lens 130, light pipe 140, first and second lens assemblies 152 and 154, protective window 160, projection lens 614, and variations thereof. Generally, optical elements are refractive or transmissive in nature, though optical elements having reflective surfaces are suitable as well, such as concave mirror 120, as expansion or contraction of the underlying element can occur, which can lead to various aberrations. For refractive optical elements thermal lensing effects are increasingly apparent as the beam propagation distance through an element increases and where beams exhibit the highest intensity or the highest power in an element.

Typically beams have a characteristic intensity profile that is non-uniform (e.g., Gaussian) and transverse to the propagation axis. As beams propagate through an optical element and interact with the bulk material therein, heat is generated and a temperature profile created in the element that is related to the intensity profile of the beam. Since the refractive index of the bulk material at a particular position therein is temperature-dependent (due to, e.g., the thermo-optical effect), beams propagating therethrough can be refracted undesirably. Additional variations in refractive index can be induced by thermo-mechanical effects, such as stress and further exacerbate thermal lensing effects. The net effect of thermal lensing can cause an undesirable shift of the focal plane of the beams propagating through the optical elements and can add other undesirable optical aberrations to the beams. Moreover, as some systems may be cycled on and off periodically, time-dependent temperature characteristics of the different optical elements can lead to different performance at the beginning or end of a cycle, or between a first and subsequent cycle.

In one example, beams propagating through light pipe 140 are multiply reflected across the interior surfaces thereof and the effective propagation length through light pipe 140 to achieve a suitable amount of homogenization may be relatively long. As the beams propagate farther through the light pipe 140, more lens-like behavior tends to be experienced. Thus, thermal lensing of incident high power beams can be very significant in the light pipe 140 element. By fabricating light pipe 140 with high purity fused silica, photons of beams propagating therethrough are less likely to become absorbed or otherwise cause localized heating in the light pipe material, and so thermal lensing can be minimized.

Cylindrical lens 130 is another optical component well-suited for fabrication with high purity fused silica. As shown earlier, lens 130 is positioned so as to direct beams 109 into light pipe 140 for homogenization. Subsequent to homogenization in light pipe 140 further beam alteration occurs with other downstream optics, such as beam conditioning optics 150 and projection lens 614. Because lens 130 is disposed farther upstream, any undesirable, unpredictable, or variable refractive effects occurring therein can have adverse effects on downstream optics as propagation distances increase. Also, because beams 109 are each carefully directed into the bulk material of lens 130, lens 130 becomes exposed to very high optical intensities and powers, increasing susceptibility to thermal lensing effects. Thermal effects can be mitigated to some degree by actively cooling optical elements. For example, in some examples of cylindrical lens 130 and light pipe 140, suitable thermally conductive elements can surround or be meshed between bulk material so as to actively stabilize or control the temperature of the element during operation. However, such systems are typically impractical or expensive, or fail to substantially eliminate thermal lensing effects.

High purity fused silica is available under a variety of trade names and often fabricated through different methods. Grades of material are generally categorized according to performance characteristics at different wavelengths. For example, some grades are specially suited for absorption avoidance at UV wavelengths, others exhibit mid-IR absorption avoidance, and still others have absorption avoidance characteristics across a broad range of suitable wavelengths. Grades of high purity fused silica can also be described based on concentrations of OH$^-$ and metals or other trace impurities. In embodiments with wavelengths between 970 nm and 980 nm, the OH$^-$ concentration of optical elements utilizing high purity fused silica is less than about 10 ppm with some examples having less than about 1 ppm and trace impurity concentration is less than about 0.05 ppm with some examples having less than about 0.005 ppm. In other embodiments, the high purity fused silica elements may have OH$^-$ and trace impurity concentrations that are higher or lower depending on application requirements and system characteristics, such as operating wavelength, peak power, and beam precision.

While laser systems disclosed herein may be used for many applications, including materials processing applications like welding or cutting, the highly stable output beam produced by systems herein enables more advanced applications requiring high precision, such as laser induced thermal imaging. Thus, in some embodiments, typical stabilities are achieved such that output beams are variable by less than a few cm laterally and in the focus direction or direction of propagation as well as even less than about 50 µm, 10 µm, 5 µm, or even 2 µm. The resulting reliable and deterministic positional accuracy of the focal plane provides superior performance across a wide range of applications for high power laser systems. For example, thermal lensing in conventional systems also typically results in a reduction of beam quality such that the spot size at the plane of focus grows undesirably.

For many applications, including LITI, a high-power and stable line is desirable, though other shapes are possible. For example, rectangular, oval, or circular output beams can be provided in some embodiments. Moreover, the light sources of some embodiments may be free-space diode lasers instead of fiber-coupled sources. With respect to fiber-coupled light sources, high-brightness single-emitter diode packages as described hereinbefore are well-suited for such high-power and stable systems, but other sources may be used, such as fiber lasers, solid state lasers, or bar-based diode packages. Laser systems herein providing high power and stable output preferably operate using light pipe 140 to achieve substantial uniformity in the output beam. However, in some embodiments a lens array may be used, which may also be made from high purity fused silica. Such systems may not have the same uniformity attributes as those using light pipe 140 but may still be suitable for some embodiments.

It is thought that the present invention and many of the attendant advantages thereof will be understood from the foregoing description and it will be apparent that various changes may be made in the parts thereof without departing from the spirit and scope of the invention or sacrificing all of its material advantages, the forms hereinbefore described being merely exemplary embodiments thereof.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

We claim:

1. A method, comprising:
    emitting a plurality of beams from respective fiber-coupled laser sources;
    receiving the plurality of beams with a cylindrical lens made of fused silica;
    telecentrically directing the plurality of beams with the cylindrical lens into a light pipe so as to form a homogenized output beam;
    focusing the homogenized output beam at a focus position; and
    reducing a thermal lensing focal variability of the homogenized output beam at the focus position to less than or equal to 50 µm in the direction of propagation of the homogenized output beam at least in part by reducing an $OH^-$ concentration to less than or equal to 10 ppm and a trace impurity concentration to less than or equal to 0.05 ppm for the cylindrical lens.

2. The method of claim 1, wherein the $OH^-$ concentration is reduced to less than or equal to 1 ppm and the trace impurity concentration is reduced to less than or equal to 0.005 ppm.

3. The method of claim 1, wherein the directing the homogenized output beam to a target with a projection lens that is made of high purity fused silica.

4. The method of claim 1, wherein the homogenized output beam is a homogenized line beam.

5. The method of claim 1, wherein the homogenized output beam has a power of 10 kW or greater.

6. The method of claim 1, wherein the homogenized output beam has a power of 20 kW or greater.

7. The method of claim 1, wherein the emitted plurality of beams have a wavelength between 400 nm and 2000 nm.

8. The method of claim 1, wherein the emitted plurality of beams have a wavelength between 970 nm and 980 nm.

9. The method of claim 1, wherein the focal variability is reduced to less than or equal to 5 µm.

10. The method of claim 1, wherein the focal variability is reduced to less than or equal to 2 µm.

11. The method of claim 1, wherein the fiber-coupled laser sources include one or more of single-emitter diode packages, bar-based diode packages, fiber lasers, solid state lasers, and/or solid state lasers.

12. The method of claim 1, wherein the homogenized output beam is configured for laser induced thermal imaging applications.

13. The method of claim 1, further comprising reducing the thermal lensing focal variability at least in part by reducing an $OH^-$ concentration to less than or equal to 10 ppm and a trace impurity concentration to less than or equal to 0.05 ppm for the light pipe.

14. The method of claim 1, further comprising before receiving the plurality of beams with the cylindrical lens, interleaving the plurality of beams with an interleaver to direct the plurality of beams into a common direction.

15. The method of claim 1, wherein the cylindrical lens is a rod lens.

16. The method of claim 1, further comprising cooling the fiber-coupled laser sources with a cooling system.

17. The method of claim 1, further comprising directing the homogenized output beam through a mask.

18. The method of claim 17, wherein the mask is situated at the focus position of the homogenized output beam.

19. The method of claim 17, further comprising directing optical power reflected at the mask to a beam dump.

20. The method of claim 1, wherein the homogenized output beam at the focus position has intensities of at least 5 kW/cm$^2$.

* * * * *